US010896824B2

(12) United States Patent
Zandi et al.

(10) Patent No.: US 10,896,824 B2
(45) Date of Patent: Jan. 19, 2021

(54) ROUGHNESS REDUCTION METHODS FOR MATERIALS USING ILLUMINATED ETCH SOLUTIONS

(71) Applicant: Tokyo Electron Limited, Tokyo (JP)

(72) Inventors: Omid Zandi, Austin, TX (US); Jacques Faguet, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/287,669

(22) Filed: Feb. 27, 2019

(65) Prior Publication Data

US 2020/0194278 A1 Jun. 18, 2020

Related U.S. Application Data

(60) Provisional application No. 62/779,604, filed on Dec. 14, 2018.

(51) Int. Cl.
*H01L 21/3213* (2006.01)
*B08B 7/00* (2006.01)
(Continued)

(52) U.S. Cl.
CPC ...... *H01L 21/32134* (2013.01); *B08B 7/0057* (2013.01); *B08B 7/04* (2013.01);
(Continued)

(58) Field of Classification Search
None
See application file for complete search history.

(56) References Cited

U.S. PATENT DOCUMENTS

| 8,530,359 | B2 | 9/2013 | Mayer et al. |
| 2006/0207629 | A1* | 9/2006 | Rastegar ............ B08B 3/10 134/1 |

(Continued)

FOREIGN PATENT DOCUMENTS

| KR | 10-1464230 B1 | 11/2014 |
| KR | 10-2016-0075145 A | 6/2016 |

OTHER PUBLICATIONS

U.S. Appl. No. 16/402,634, filed May 3, 2019, US 2020-0075351 A1, Omid Zandi, et al.
(Continued)

*Primary Examiner* — Jiong-Ping Lu
(74) *Attorney, Agent, or Firm* — Oblon, McClelland, Maier & Neustadt, L.L.P.

(57) ABSTRACT

Methods are disclosed that illuminate etch solutions to provide controlled etching of materials. An etch solution (e.g., gaseous, liquid, or combination thereof) with a first level of reactants is applied to the surface of a material to be etched. The etch solution is illuminated to cause the etch solution to have a second level of reactants that is greater than the first level. The surface of the material is modified (e.g., oxidized) with the illuminated etch solution, and the modified layer of material is removed. The exposing and removing can be repeated or cycled to etch the material. Further, for oxidation/dissolution embodiments the oxidation and dissolution can occur simultaneously, and the oxidation rate can be greater than the dissolution rate. The material can be a polycrystalline material, a polycrystalline metal, and/or other material. One etch solution can include hydrogen peroxide that is illuminated to form hydroxyl radicals.

27 Claims, 7 Drawing Sheets

(51) Int. Cl.
  *B08B 7/04* (2006.01)
  *B24B 37/04* (2012.01)
  *C09G 1/00* (2006.01)
  *C09G 1/06* (2006.01)
  *C09G 1/02* (2006.01)
  *C09K 13/06* (2006.01)
  *B24B 1/00* (2006.01)
  *C09G 1/04* (2006.01)
  *H01L 21/306* (2006.01)
  *C09K 3/14* (2006.01)

(52) U.S. Cl.
  CPC .............. *B24B 1/00* (2013.01); *B24B 37/044* (2013.01); *C09G 1/00* (2013.01); *C09G 1/02* (2013.01); *C09G 1/04* (2013.01); *C09G 1/06* (2013.01); *C09K 3/1454* (2013.01); *C09K 3/1463* (2013.01); *C09K 13/06* (2013.01); *H01L 21/30625* (2013.01); *H01L 21/3213* (2013.01); *H01L 21/32138* (2013.01)

(56) References Cited

U.S. PATENT DOCUMENTS

| | | |
|---|---|---|
| 2008/0217294 A1 | 9/2008 | Ko et al. |
| 2009/0114619 A1* | 5/2009 | Sotoaka .................... C23F 1/02 216/48 |
| 2010/0009514 A1 | 1/2010 | Lee et al. |
| 2015/0128990 A1* | 5/2015 | Brown ...................... B08B 3/08 134/1 |
| 2016/0130500 A1* | 5/2016 | Chen ........................ C11D 3/30 216/13 |

OTHER PUBLICATIONS

International Search Report and Written Opinion dated Apr. 7, 2020, in corresponding Application PCT/US2019/065494 filed on Dec. 10, 2019, therein (15 pages).

* cited by examiner

ROUGHNESS REDUCTION METHODS FOR MATERIALS USING ILLUMINATED ETCH SOLUTIONS

RELATED APPLICATIONS

This application claims priority to the following provisional application: U.S. Provisional Patent Application Ser. No. 62/779,604, filed Dec. 14, 2018, and entitled "ROUGHNESS REDUCTION METHODS FOR WET ETCH OF POLYCRYSTALLINE MATERIALS," which is hereby incorporated by reference in its entirety.

BACKGROUND

The present disclosure relates to methods for the manufacture of microelectronic workpieces including etch processes for material layers on microelectronic workpieces.

Device formation within microelectronic workpieces typically involves a series of manufacturing techniques related to the formation, patterning, and removal of a number of layers of material on a substrate for the microelectronic workpiece. Etch processes are often used for the removal of material layers from a surface of the substrate. Controlling etch uniformity at macroscale and microscale is becoming increasingly difficult as the feature size of to-be-etched materials continues to shrink for the electronic devices formed on the microelectronic workpieces. Traditional wet etch processes that use liquid etch solutions often lack precise nanoscale control over the etch behavior. This lack of control becomes problematic where small amounts of materials are to be removed and/or where a smooth surface finish is desired.

Roughness control during etch processes for polycrystalline materials in particular is a challenging task. Polycrystalline materials exhibit variable reactivity toward etchants depending on the surface crystallographic orientation of the polycrystalline materials. Polycrystalline materials also exhibit variable reactivity toward etchants at grain boundaries and defect sites for the polycrystalline materials. This variable reactivity leads to undesired etch variability and surface roughness in traditional wet etch processes.

Figure 1A:
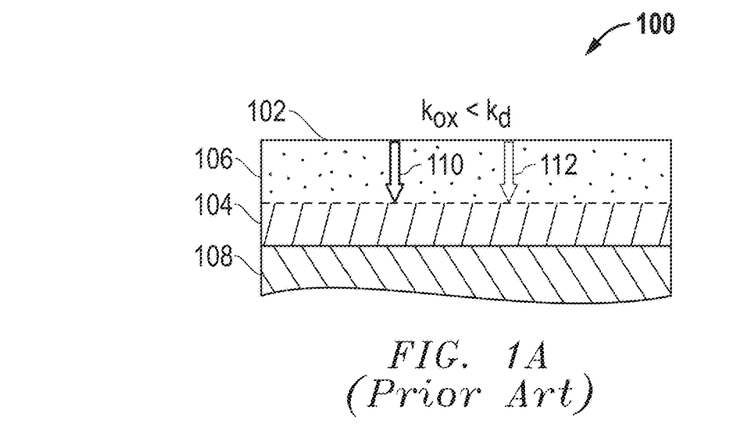
FIG. 1A (Prior Art) provides a diagram associated with prior etch solutions that suffer from problems associated with variable reactivity and undesired etch variability.
Figure 1B:
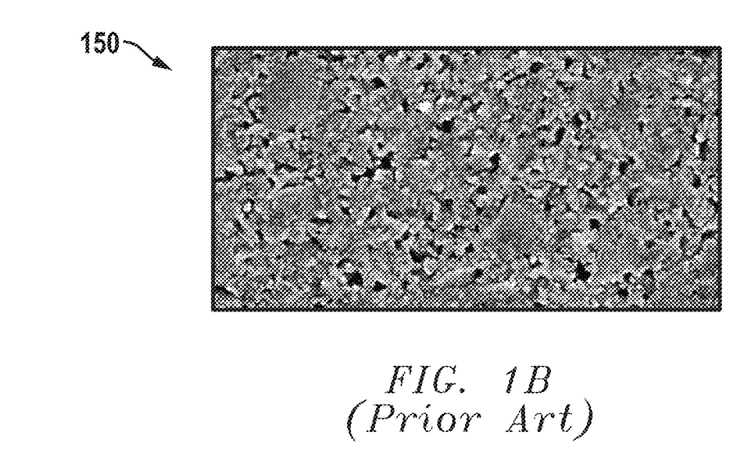
FIG. 1B (Prior Art) provides a representative surface image for the pitting and roughening of a surface due to the undesired etch variability associated with the traditional oxidation-dissolution approach of FIG. 1 A (Prior Art).

FIGS. 1A-1B (Prior Art) provide diagrams associated with such prior etch solutions and related problems with variable reactivity and undesired etch variability.

Looking first to FIG. 1A (prior art), an example embodiment 100 is provided for the traditional etch approach. A liquid etch solution 106 is applied to a material 104 on the surface of a substrate 108 for a microelectronic workpiece. For the example embodiment 100, the material 104 being etched is a cobalt (Co), and this material 104 has been previously formed on the surface of the substrate 108. For the example embodiment 100, the liquid etch solution 106 provides an oxidation-dissolution etch mechanism. For this oxidation-dissolution etch mechanism, the material 104 is oxidized by the liquid etch solution 106 and then dissolved by the liquid etch solution 106.

The traditional oxidation-dissolution etch mechanism for cobalt leads to significant roughening and pitting. For this traditional approach, cobalt etch is driven by an oxidation/dissolution mechanism where the oxidant (e.g., hydrogen peroxide) oxidizes cobalt (Co) to form $CoO_x$ with an oxidation rate constant of $k_{ox}$ as represented by arrow 110. $CoO_x$ is then dissolved into the solution through complexation with etchant molecules (e.g., citrate anions) with a dissolution rate constant of $k_d$ as represented by arrow 112. For this traditional approach, $k_{ox}$ is less than $k_d$ ($k_{ox} < k_d$), and this condition results in non-uniform etch at grain boundaries for the polycrystalline cobalt leading to pitting and roughening of the surface.

FIG. 1B (prior art) provides a representative surface image 150 for this pitting and roughening of a surface due to the undesired etch variability associated with the traditional oxidation-dissolution approach. In contrast, an ideal wet etch process would provide a constant etch rate independent of the surface chemistry (e.g., grain boundaries) of the material being etched.

SUMMARY

Embodiments are described herein that use illumination of etch solutions to provide controlled etching of materials. For one embodiment, disclosed methods include depositing etch solutions (e.g., at least one of gaseous etch solution, a liquid etch solution, or a combination thereof) over a material where the etch solutions contain reactants to react with the material surface, ultimately leading to etching of the material. The material being etched can be, for example, a polycrystalline material, a polycrystalline metal, and/or other material to be etched or polished. The disclosed embodiments use illumination as an external tool to control etchant reactivity in the etch solution contacting the material, thereby allowing for modifications to the etch behavior. Chemical composition as well as other parameters can also be used in part to control the etch behavior and post-etch surface morphology and chemistry. The disclosed embodiments thereby control and/or reduce surface roughness during etching of materials, such as polycrystalline materials, both at microscopic and macroscopic level. These results are achieved through illumination of etch solutions applied to the material surface to provide point-of-use generation of highly reactive etchants that etch the material independent of surface chemistry of the material. For one example embodiment, the liquid etch solution is an aqueous solution including hydrogen peroxide, and hydroxyl radicals are generated by illumination (e.g., using ultraviolet light) to form highly reactive etchants. Different or additional features, variations, and embodiments can also be implemented, and related systems and methods can be utilized as well.

For one embodiment, a method of processing a substrate for a microelectronic workpiece is disclosed including receiving a substrate for a microelectronic workpiece having a material to be etched from a surface of the substrate, applying an etch solution to the surface of the substrate, the etch solution having a first level of reactants with respect to the material, exposing the etch solution and the surface of the material to illumination to form a modified layer of material on the surface of the material where the exposing causes the etch solution to have a second level of reactants with respect to the material that is greater than the first level, and removing the modified layer of material.

In additional embodiments, the etch solution includes at least one of gaseous etch solution, a liquid etch solution, or a combination thereof. In further embodiments, the method includes repeating the exposing and removing in a cyclic manner to etch the material. In further embodiments, the exposing and removing are performed in a single process step. In still further embodiments, the exposing and removing are performed in different process steps.

In additional embodiments, the etch solution includes a liquid etch solution and the exposing oxidizes the surface of the material to form oxidized material as the modified layer. In further embodiments, a uniform layer of oxidized material is formed, and the removing includes using the liquid etch solution in a separate process step to dissolve the oxidized material. In further embodiments, the etch solution includes an aqueous solution including hydrogen peroxide, and the removing includes using an aqueous solution including a complexing agent. In still further embodiments, the complexing agent includes at least one of citrate, ethylene diamine, ethylendiamintetraacetate (EDTA), malic acid, oxalic acid, glycine, alanine, or iminodiacetic acid.

In additional embodiments, the removing includes dissolving the oxidized material using the liquid etch solution simultaneously with the oxidizing, and the oxidizing has an oxidation rate constant greater than a dissolution rate constant for the dissolving. In further embodiments, the liquid etch solution includes an aqueous solution including hydrogen peroxide and citrate.

In additional embodiments, the material to be etched includes a polycrystalline metal. In further embodiments, the polycrystalline metal includes cobalt.

In additional embodiments, the liquid etch solution includes hydrogen peroxide. In further embodiments, the illuminating of the hydrogen peroxide causes formation of hydroxyl radicals within the liquid etch solution, and the second level of reactants are caused at least in part by the formation of the hydroxyl radicals. In still further embodiments, the illuminating includes illuminating the liquid etch solution with light having a wavelength of less than 560 nm. In still further embodiments, illuminating includes illuminating the liquid etch solution with ultraviolet (UV) light having a wavelength from 10 nm to 400 nm. In further embodiments, the hydroxyl radicals oxidize the material.

In additional embodiments, the exposing includes selectively illuminating the etch solution. In further embodiments, the selectively illumination includes illuminating with ultraviolet (UV) light in one or more on/off patterns. In further embodiments, the selectively illuminating includes using two or more different colors of light. In still further embodiments, the removing also includes using two or more different colors of light to illuminate the modified layer of material. In further embodiments, the selectively illuminating includes illuminating one or more regions of the etch solution where a modified layer is desired and not illuminating other regions of the etch solution.

In additional embodiments, the method also includes controlling the exposing to compensate for uneven layer thickness within the surface. In further embodiments, the etch solution includes an aqueous solution including at least one of ozone or hypochlorous acid.

In additional embodiments, the method also includes adjusting the exposing so that different regions of the etch solution are exposed differently to provide different amounts of etching within the different regions. In further embodiments, the method also includes measuring the material and controlling the adjusting based upon the measuring to provide feed-forward control. In still further embodiments, the measuring includes measuring at least one of a topology for a surface of the material or a thickness of the material.

For one embodiment, a method of processing a substrate for a microelectronic workpiece is disclosed including receiving a substrate for a microelectronic workpiece having a polycrystalline metal to be etched from a surface of the substrate, applying a liquid etch solution including hydrogen peroxide to the surface of the substrate where the liquid etch solution has a first level of reactants with respect to the polycrystalline metal, illuminating the liquid etch solution to cause formation of hydroxyl radicals from the hydrogen peroxide where the formation of hydroxyl radicals at least in part causes the liquid etch solution to have a second level of reactants with respect to the polycrystalline metal and where the second level of reactants is greater than the first level of reactants, oxidizing the polycrystalline metal with the liquid etch solution to form an oxidized metal, and removing the oxidized metal.

In additional embodiments, the method also includes repeating the illuminating, oxidizing, and removing to etch the polycrystalline metal. In further embodiments, the removing includes dissolving the oxidized metal using the liquid etch solution simultaneously with the oxidizing where the oxidizing has an oxidation rate constant greater than a dissolution rate constant for the dissolving.

For one embodiment, a method to polish a surface of a material is disclosed including receiving a material to be polished, applying an etch solution to a surface of the material where the etch solution has a first level of reactants with respect to the material, exposing the etch solution and the surface of the material to illumination to form a modified layer of material on the surface of the material where the exposing causes the etch solution to have a second level of reactants with respect to the material that is greater than the first level, and removing the modified layer of material to cause the material to have a polished surface where the polished surface has less surface variation than the surface of the material before the exposing and removing.

In additional embodiments, the etch solution includes at least one of gaseous etch solution, a liquid etch solution, or a combination thereof. In further embodiments, the method also includes repeating the exposing and removing in a cyclic manner to polish the material.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

As described herein, methods are disclosed to provide controlled etching of materials, such as polycrystalline materials or metals, using illumination to adjust etchant reactivity and facilitate etching that is independent of surface chemistry of the material. Other advantages and implementations can also be achieved while still taking advantage of the process techniques described herein.

Controlling nanoscale etch uniformity helps to minimize device failure in microelectronic devices and circuits being formed on microelectronic workpieces. Conventional wet etch chemistries are often unable to provide precise etch control of materials such as polycrystalline materials and metals. For example, variable etch rates at grain boundaries and/or on different crystal facets for polycrystalline materials can lead to surface roughening during etch. The disclosed embodiments provide a method to achieve etch uniformity at both microscale and macroscale by point-of-use generation of highly reactive etchants through controlled illumination. For one embodiment, the disclosed embodiments provide these beneficial results when used to etch metallic polycrystalline structures such as polycrystalline metallic cobalt. Other polycrystalline materials and polycrystalline metals as well as other materials and can also be etched using the illumination techniques described herein.

For one embodiment, highly reactive hydroxyl radicals (HO*) are generated as an etchant for a polycrystalline material through illumination of a liquid etch solution applied to the surface of the polycrystalline material. The hydroxyl radicals are strong oxidizers and etch the polycrystalline material at room temperature. For one embodiment, the hydroxyl radicals are generated using ultraviolet (UV) light illumination of an aqueous solution of hydrogen peroxide ($H_2O_2$) that is contacting the material to be etched. The illumination can also be selectively provided at point-of-use to better control etch processes and rates.

For this point-of-use solution, one or more regions of the liquid etch solution (e.g., aqueous solution of hydrogen peroxide) are selectively illuminated where etching of the surface is desired, and other regions where etching is not desired are not illuminated. For example, the illumination of hydrogen peroxide causes the formation of hydroxyl radicals that lead to an increased level of reactants. Once the illumination is removed, however, the hydroxyl radicals have a short lifetime and are quickly absorbed back into the aqueous solution. For example, the lifetime for the hydroxyl radicals after removal of illumination is less than 2-5 microseconds. As such, selective UV illumination can be used to tune the etchant reactivity thus modifying the thermodynamics and kinetics of etch reactions for selected regions of the liquid etch solution. High reactivity coupled to the microsecond lifetime of hydroxyl radicals allows for rapid and/or near instantaneous oxidation of the material surface layers independent of the local surface reactivity. Subsequent removal of the oxidized layers renders a smooth etched surface. Additionally, large scale etch uniformity can be achieved by spatially adjusting the UV light intensity in a feed-forward process during the illumination process. Other variations can also be implemented while still taking advantage of the techniques described herein.

One significant advantage of the disclosed embodiments is the ability to tune near-instantaneously etchant reactivity in-situ using controlled illumination. This tuning ability allows access to wider parameter space on a potential-pH diagram (i.e., Pourbaix diagram) of photosensitive etchants without the need to mix additional reactants and chemicals. This simplifies the process chemistry and reduces cost for wet etch processes.

As described herein, the disclosed embodiments provide one or more of the following: (1) tuning of etchant reactivity in real-time and at point-of-use thereby allowing etch behavior to be tuned without the need for additional chemical mixtures or aggressive conditions, (2) utilizing the short lifetimes of reactive, transient excited states by creating them at the surface of a microelectronic workpiece (e.g., semiconductor wafer) and then using them to etch the surface, (3) controlling surface roughness during etching of polycrystalline materials, (4) allowing for temporal and spatial control of etch rates on a surface of a microelectronic workpiece, and/or (5) providing feed forward control to compensate for uneven layer thickness across a microelectronic workpiece. Additional and/or different advantages and features can also be provided according to the techniques described herein.

FIGS. 2A-2B and FIGS. 3A-3C provide diagrams associated with the disclosed embodiments where illumination is used to adjust etch rates for liquid etch solutions applied to polycrystalline materials being etched on the surface of a microelectronic workpiece. Additional and/or different embodiments can also be implemented while taking advantage of the techniques described herein.

It is noted that the illumination described herein can be selective illumination applied in real-time to provide point-of-use control. A liquid etch solution typically has a set reactivity and etch rate for a given material based on the composition and temperature of the solution. The disclosed embodiments adjust the etch behavior of a liquid etch solution having a given composition at a given temperature in real time. In addition, the disclosed embodiments allow adjustment of the etch rate with respect to the position and/or location of a material on the surface of the microelectronic workpiece, and feed-forward control can be utilized to achieve greater uniformity across the microelectronic workpiece.

It is further noted that a traditional etch solution has a set solution potential and a set pH. The set solution potential and the set pH for the solution places the solution at single point on a Pourbaix diagram. The parameters are set by the solution composition. This solution composition uniquely sets the thermodynamic equilibrium species that will be present when the solution is placed in contact with a surface to be etched, and also sets the solubility of the etch products. As such, the etch behavior of the system is determined.

In contrast, the disclosed embodiments provide wet etch processes in which illumination is used to tune the etchant reactivity and/or potential for an etch solution and thus achieve a desired etch behavior. For the embodiments herein, the etch solution contains a photosensitive compound that undergoes photochemical reactions based upon illumination to generate reactive etchants (e.g., radicals or radical ions). The liquid etch solution may also contain additional components to solubilize or volatilize the etch products.

For one embodiment, hydroxyl radicals (HO*) are used as a transient, excited-state species and are generated from photolysis of hydrogen peroxide. Other examples include but are not limited to singlet oxygen, excited-state molecules, radicals, dimers, complexes, and/or other materials having properties where reactive etchants are generated and/or adjusted through illumination. For example, similar reactive species can be generated from photolysis of aqueous solution of ozone or hypochlorous acid. Other variations could also be implemented.

For one example implementation, the disclosed embodiments are used to reduce roughening in etching of polycrystalline metal materials. In a further example embodiment, the polycrystalline metal material is cobalt.

Wet etching of polycrystalline materials is often achieved through an oxidation-dissolution mechanism. Etchant solutions contain oxidizers and reactants that promote the dissolution of the etch products. The etch behavior (e.g., etch rate, etch uniformity) and thus the final surface morphology is a function of the chemical reaction in place on the surface of the materials to be etched. Variable etch rates on polycrystalline materials is a common problem to traditional wet etch processes where this variability often leads to undesirable surface morphologies such as roughening and pitting. The tuning of oxidation and dissolution reaction rates through illumination, preferably in real time, as described herein allows the etch behavior to be modified and uniform etching to be achieved.

Hydrogen peroxide is an etchant commonly used in wet etch processes. As recognized in the current embodiments, illumination of hydrogen peroxide with light of wavelength ($\lambda$) less than 560 nanometers (nm) (i.e., $\lambda<560$ nm) results in the quantitative photolysis that forms hydroxyl radicals. For example, UV light having a wavelength from 10 nm to 400 nm can be used for this illumination (e.g., $10\ nm \leq \lambda \leq 400$ nm). Hydroxyl radicals possess very high oxidation potential (e.g., 2.8 Volts) and have microsecond lifetime (e.g., lifetime $\leq$2-5 microseconds). The combination of high reactivity and short lifetime allows a uniform surface layer to be oxidized nearly instantaneously, and this oxidized surface layer can then be removed.

Cobalt can be considered as an example polycrystalline material that can be etched using the disclosed embodiments.

Figure 2A:
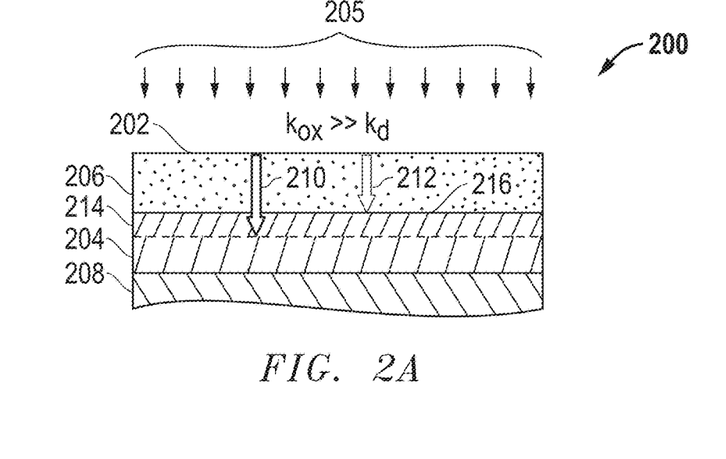
FIG. 2A provides an example embodiment where illumination of a liquid etch solution is used to facilitate control, and preferably real time control, of etch rates and uniformity for the etch of a material on the surface of a substrate for a microelectronic workpiece.

Looking first to FIG. 2A, an example embodiment 200 is provided according to the disclosed techniques where illumination of a liquid etch solution is used to facilitate control, and preferably real time control, of etch rates and uniformity as described herein. A liquid etch solution 206 is applied to a material 204 on the surface of a substrate 208 for a microelectronic workpiece. For the example embodiment 200, the material 204 being etched is a cobalt (Co), and this material 204 has been previously formed on the surface of the substrate 208. For the example embodiment 200, the liquid etch solution 206 provides an oxidation-dissolution etch mechanism. For this oxidation-dissolution etch mechanism, the material 204 is oxidized by the liquid etch solution 206 and then dissolved by the liquid etch solution 206. In contrast to prior solutions and according to the techniques described herein, illumination 205 is used to cause the liquid etch solution 206 to transition from a first level of reactants with respect to the material 204 on the surface of the substrate 208 to a second level of reactants with respect to the material 204. Further, the second level of reactants is greater than the first level of reactants.

For one embodiment, a liquid etch solution including hydrogen peroxide ($H_2O_2$) is used. When illuminated with UV light, the hydrogen peroxide cleaves to form two hydroxyl radicals (OH*). This formation of hydroxyl radicals increases the oxidation potential of the solution from about 1.8 volts (V) to about 2.8 V. Reactive hydroxyl radicals speed up the oxidation reaction and cause oxidation rate constant $k_{ox}$, as represented by arrow 210, to be much greater than the dissolution rate constant $k_d$, as represented by arrow 212. This significantly increased oxidation rate with respect to the dissolution rate ($k_{ox} >> k_d$) facilitates the formation of a thin and uniform layer of an oxidized material 214 on the material surface at a constant rate. This oxidized material 214 is then removed slowly rendering a smooth surface. Where cobalt is the material 108, cobalt oxide ($CoO_x$) is the oxidized material 214.

Figure 2B:
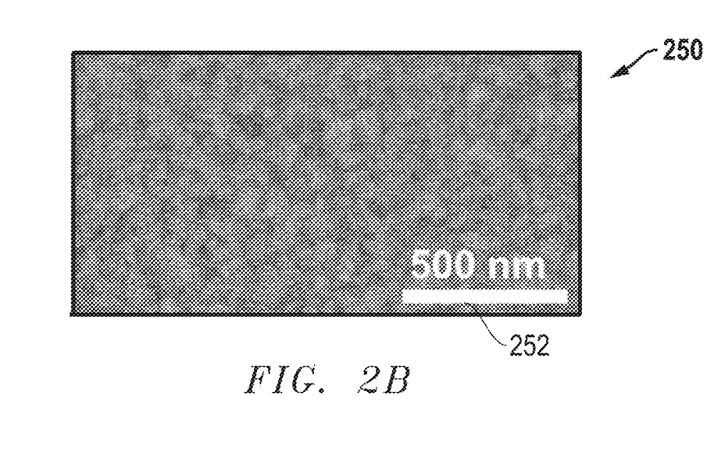
FIG. 2B provides a representative surface image for a smooth surface achieved due to the increased etch uniformity associated with the illumination approach of FIG. 2A.

FIG. 2B provides a representative surface image 250 for this smooth surface due to the increased etch uniformity associated with the illumination approach of the disclosed embodiments described herein. For representative surface image 250, the scale is provided by bar 252 that represents a length of 500 nm.

It is noted that the rapid formation of the surface oxide layer additionally blocks etchant diffusion through grain boundaries and defect sites for the polycrystalline material thereby reducing or minimizing pitting. From surface morphology analysis, pitting related corrosion also did not occur under or was reduced using the illumination techniques described herein. In addition, surface roughness was decreased significantly from initial values. Additional and/or different advantages may also be achieved.

Example process modes were also tested using UV-enhanced peroxide (UVP) wet etch methods described herein with respect to etching of polycrystalline materials. For these example process modes, polycrystalline cobalt was etched using two example process modes where UVP wet etch methods were applied: a continuous UVP process and a cyclic oxidation-dissolution process.

For the continuous UVP process example, a mixture of hydrogen peroxide ($H_2O_2$) and citric acid (e.g., in the form of citrate) adjusted to pH of 10 (pH=10) was used. The oxidation and dissolution reactions in this mode are simultaneous. Results of this process where illumination was used is shown in FIG. 2B with respect to representative image 250. Results of this process where illumination was not used is shown in FIG. 1B (prior art) with respect to representative surface image 150.

As described above, FIG. 1A (Prior Art) provides an example embodiment 100 for the oxidation and dissolution reaction rate of cobalt in contact with an aqueous solution of hydrogen peroxide ($H_2O_2$) and citrate in the absence of UV illumination. FIG. 1B (prior art) corresponds to an example surface image 150 of post-etch morphology for the process without UV illumination as represented by FIG. 1A (Prior Art).

In contrast as described above, FIG. 2A provides an example embodiment 200 for the oxidation and dissolution reaction rate of cobalt in contact with an aqueous solution of $H_2O_2$ and citrate in the presence of UV illumination. FIG. 2B corresponds to an example surface image 250 of post-etch morphology for the process with UV illumination as represented by FIG. 2A. UV illumination generates transient hydroxyl radicals enabling higher oxidation rates which lead to a decrease in surface roughness even for very low etch amounts.

For one embodiment, a cyclic process mode is used. For this cyclic process mode example, the oxidation and dissolution reactions are separated. In the first step, cobalt is oxidized with the illumination process (e.g., UVP process) in the absence of citrate (e.g., dissolution removed) for a given time. The layer of oxidized material (e.g., oxidized cobalt) is then removed using an aqueous solution of citric acid (e.g., in the form of citrate). Careful control of UVP oxidation and dissolution times allows cobalt to be etched uniformly.

It is noted that the complexing agent is not limited to citrate, and different complexing agents can also be used to this purpose. For example, complexing agents can include ligands from the family of carboxylic acids, amines, aminoacids, alcohols, and the like. Examples include but are not limited to: ethylene diamine, ethylendiamintetraacetate (EDTA), malic acid, oxalic acid, glycine, alanine, and iminodiacetic acid. It is further noted that the removal rate depends on the type of the complexing agent.

Figure 3A:
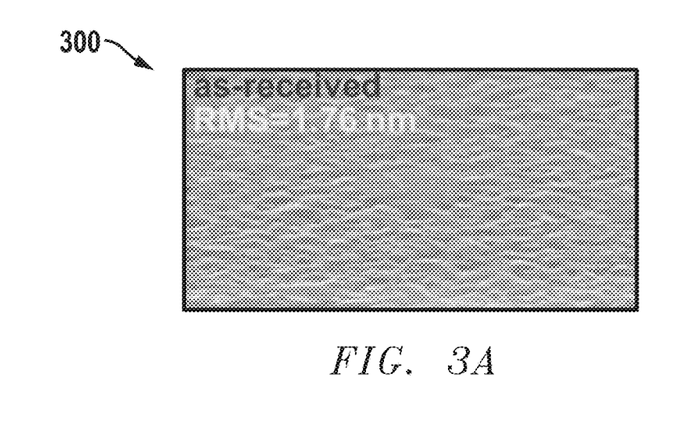
FIG. 3A provides a representative surface image for roughness prior to a cyclic process mode where oxidation and dissolution reactions are separated.
Figure 3B:
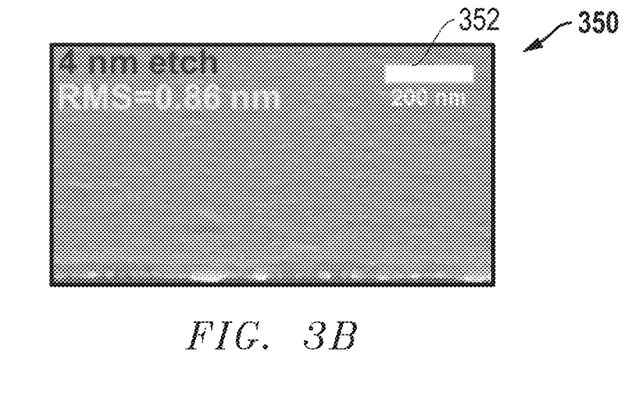
FIG. 3B provides a representative surface image for the roughness reduction as compared to FIG. 3A after the etch processing using a cyclic process mode.
Figure 3C:
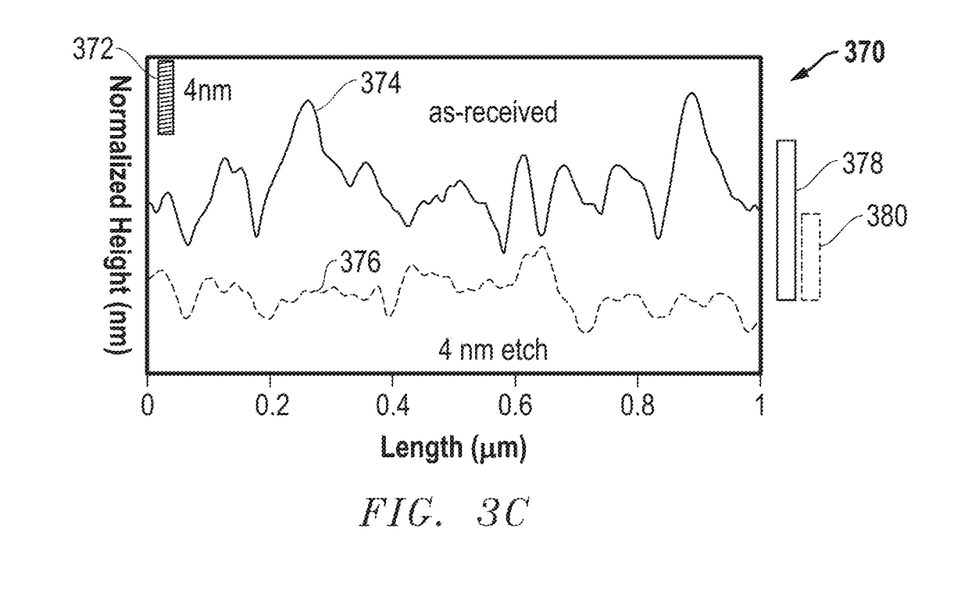
FIG. 3C provides a representative diagram for AFM (atomic force microscopy) surface roughness profiles before and after etch processing represented by the surface images in FIG. 3A and FIG. 3B.

FIGS. 3A-3C provide representative results of this cyclic process mode.

FIG. 3A provides a representative surface image 300 for roughness prior to the cyclic process. This diagram represents the material on the surface of a substrate as received. For this example, the thickness of the material layer is 30 nm, and the RMS (root mean square) roughness is 1.76 nm.

FIG. 3B provides a representative surface image 350 for the roughness reduction as compared to FIG. 3A after the etching of polycrystalline cobalt using a cyclic UVP process. The etch has removed 4 nm so that the thickness of the material layer is now 26 nm. The RMS roughness has improved to 0.86 nm, and the reduction in roughness is visible within the surface image. For representative surface image 350, the scale is provided by bar 352 that represents a length of 200 nm.

FIG. 3C provides a representative diagram 370 for AFM (atomic force microscopy) surface roughness profiles 374/376 before and after etch processing represented by the surface images in FIG. 3A and FIG. 3B. The roughness profiles 374/376 show the smoothening effect of the etch process, for example, after etching of 4 nm from the surface of polycrystalline cobalt. The vertical axis represents the normalized height of the surface in nanometers, and the horizontal axis represents a length in micrometers (µm) in one direction along the surface of the material. The top line is the roughness profile 374 representing the surface of the material as received, and the surface variation as received is represented by bar 378. The bottom line is the roughness profile 376 representing the surface of the material after the 4 nm etch, and the surface variation after etch is represented by bar 380. For representative diagram 370 and the roughness profiles 374/376, the scale is provided by bar 372 that represents a length of 4 nm. As is seen, the surface roughness has been reduced considerably by the cyclic process.

For additional embodiments, etch rates can be controlled across a relatively large surface area for the substrate of a microelectronic workpiece through spatial and/or temporal control of UV light intensity delivered to the liquid etch solution. For example, for spatial control, different regions of the liquid etch solution can be illuminated with UV light while other regions of the liquid etch solution remain unexposed to the UV light. For temporal control, UV light can be applied to different regions of the surface for different amounts of time. As such, by adjusting the spatial and/or temporal illumination of the surface for the microelectronic workpiece, different rates of etching are achieved.

A variety of illumination systems can be used for illumination of the liquid etch solution applied to the surface of substrate for a microelectronic workpiece including a spinner solution and a laser/scanner solution. When implemented on a spinner, the illuminating light source can optionally be synchronized to the motion of the substrate, enabling individual regions of the wafer to be illuminated at a time-invariant intensity. Spatially resolved illumination, for example, can be achieved with a light emitting diode (LED) array. An LED array works well when low spatial resolution is acceptable. The LED array can be rotated synchronously to the substrate in the spin chamber, or the spatial intensity of the array can be synchronized to the motion of the wafer. When higher spatial resolution is desired, illumination can be provided using a laser source and a scanner. The laser source can be moved/scanned over the wafer surface in a motion that provides higher light intensities to areas of the wafer that require higher etch rates. Both of these example implementations can be used to illuminate the wafer with a single wavelength or multiple wavelengths to adjust the reactants in the wet etch solution. It is noted that other light sources can also be used. Further, light sources can be combined, for example, zone flood exposure augmented with precise laser scanning could be used as an illumination system. Other variations and implementations could also be used while still taking advantage of the techniques described herein.

Figure 4A:
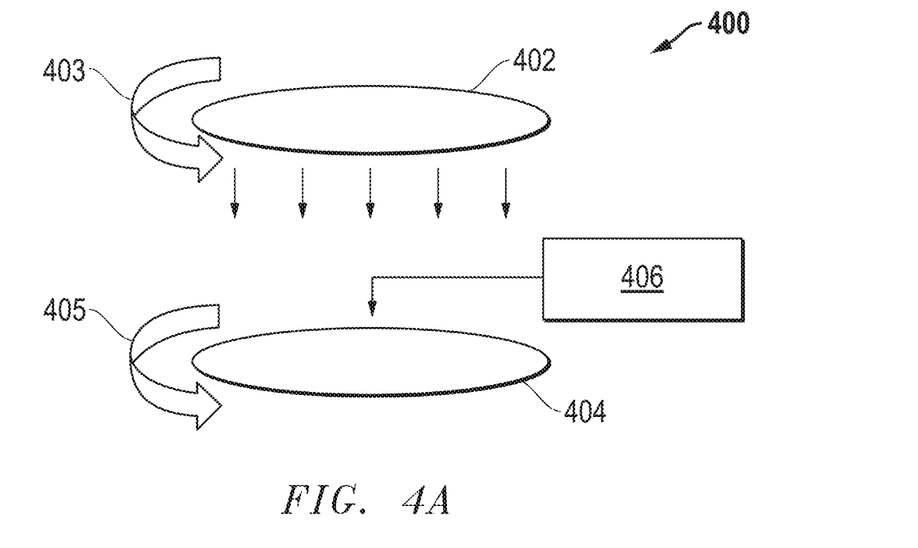
FIG. 4A provides an example embodiment 400 for a scanner solution where a light emitting diode (LED) array is used for illumination of a liquid etch solution applied to the surface of a substrate for a microelectronic workpiece.
Figure 4B:
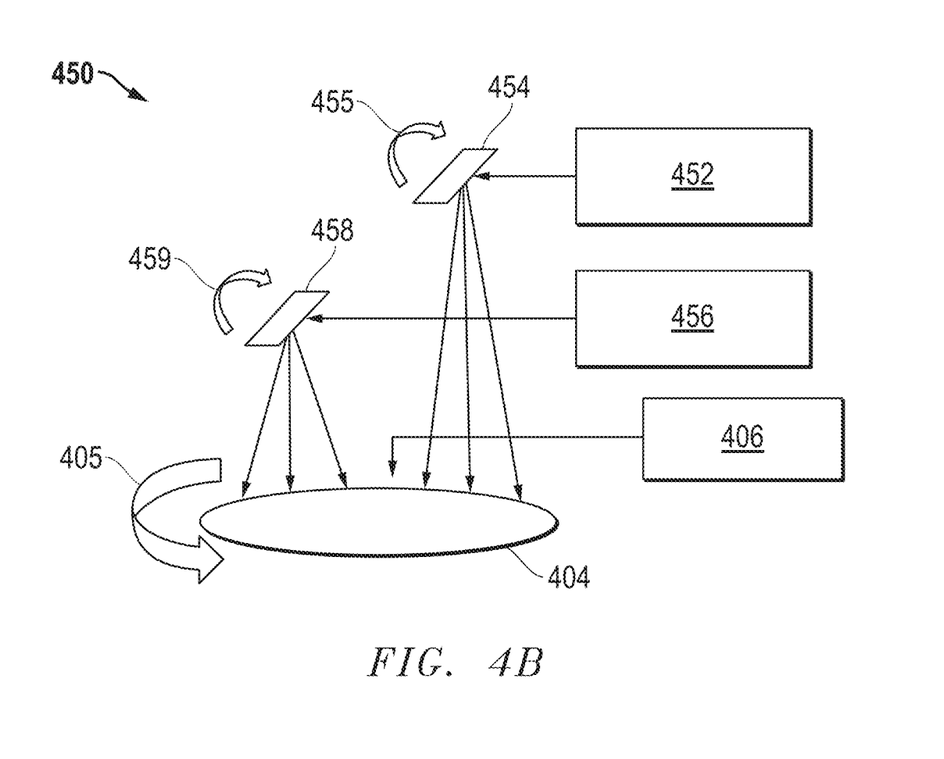
FIG. 4B provides an example embodiment where illumination of a liquid etch solution dispensed on the surface of a substrate for a microelectronic workpiece is delivered by one or more laser sources.

FIGS. 4A-4B provide example embodiments for a scanner solution and a laser/scanner solution with respect to the illumination of the surface of a microelectronic workpiece.

Looking first to FIG. 4A, an example embodiment 400 is provided for a scanner solution where an LED array 402 is used for illumination of a liquid etch solution applied to the surface of a substrate for a microelectronic workpiece, such as a semiconductor wafer 404. Before illumination, a liquid etch solution is dispensed on the surface of the wafer 404 within a spin chamber using a delivery system 406. For example embodiment 400, the LED array 402 can be a single wavelength or can be multiple wavelengths by interspersing different emitters within the array. Power of the individual emitters can be adjusted in real time to control the illumination intensity across the surface of the wafer. For one embodiment, the LED array 402 is mechanically synchronized to the motion of the wafer 404 as indicated by arrows 403 and 405. For another embodiment, the LED array 402 remains stationary while an intensity of the individual emitters is synchronized to the motion of the wafer 404. Additional variations can also be implemented.

FIG. 4B provides an example embodiment 450 where illumination of a liquid etch solution dispensed on the surface of a substrate for a microelectronic workpiece, such as a semiconductor wafer 404, is delivered by one or more laser sources 452/456. Before illumination, a liquid etch solution is dispensed on the surface of the wafer 404 within a spin chamber using a delivery system 406. A single laser or multiple laser sources 452/456 are then used for illumination. Multiple laser sources 452/456 can be used, for example, where it is desired to illuminate the wafer 404 with multiple wavelengths. Steering optics 454/458 are used to raster the laser beams from laser sources 452/456 over the wafer surface. The dwell time of a laser spot on an individual point on the surface of wafer 404 controls the etch enhancement at that point. Motion of the laser beam can be synchronized to the motion of the wafer 404 as represented by arrows 405, 455, and 459.

For further additional embodiments, etch uniformity can be improved across a relatively large surface area for the substrate of a microelectronic workpiece through feed-forward techniques. For example, the topology and/or layer thickness for the surface of a substrate can be measured across a selected surface area, and etch amounts for different regions within this surface area can be determined based upon the measurements and desired results. For example, if a smooth resulting surface is desired, spatial and/or temporal control of UV light illumination can be used to adjust local etch rates so that peaks and valleys within the topology are evened out to achieve the desired target surface parameters. As such, the feed-forward control provides a technique to compensate for uneven layer thickness and/or other variations across a microelectronic workpiece.

Figure 5A:
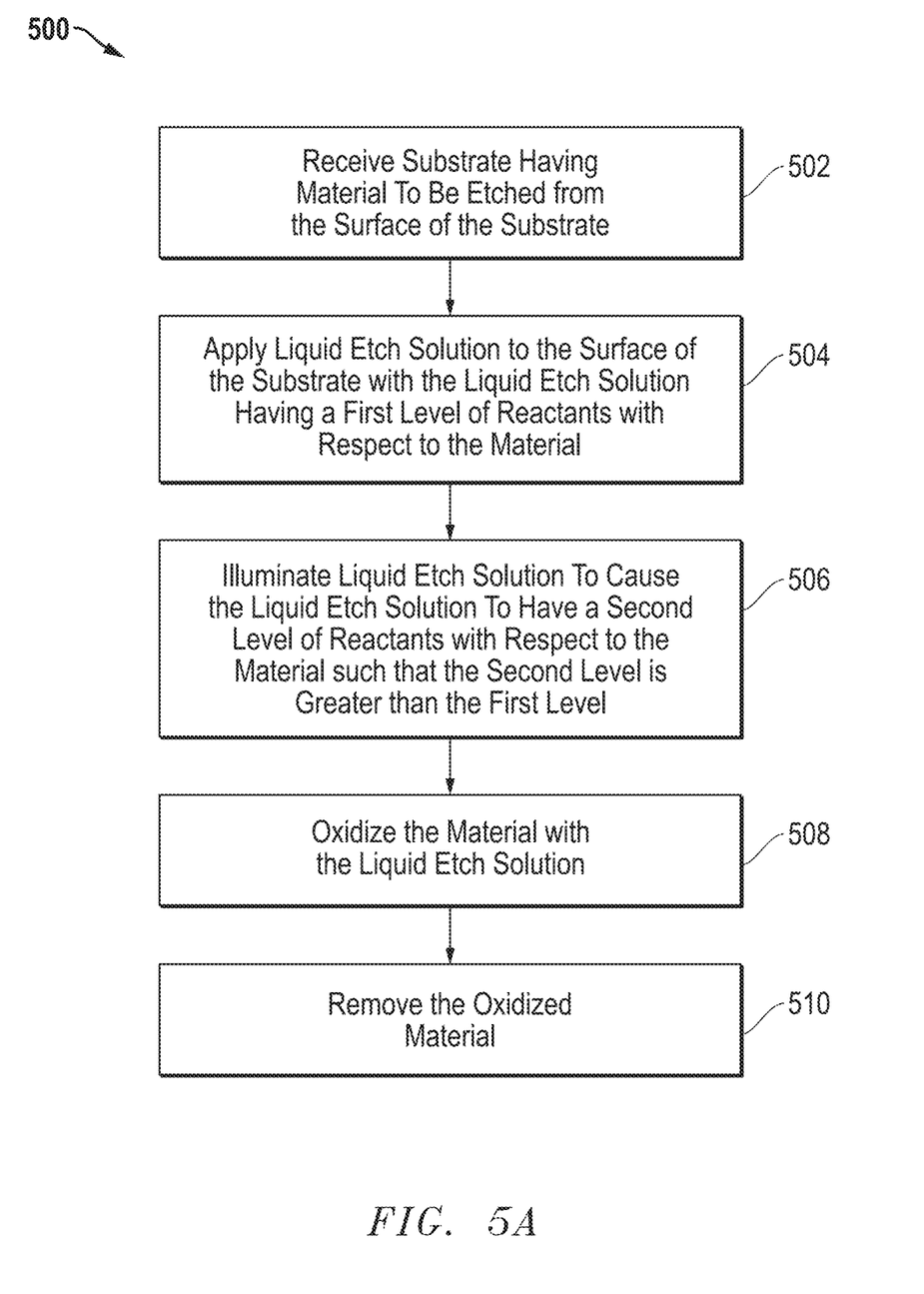
FIG. 5A is a process flow diagram of an example embodiment where illumination is used to adjust reactants within a liquid etch solution thereby improving etch uniformity for an etch of a material on the surface of a substrate for a microelectronic workpiece.

FIG. 5A is a process flow diagram of an example embodiment 500 where illumination is used to adjust reactants within a liquid etch solution thereby improving etch uniformity for an etch of a material on the surface of a substrate for a microelectronic workpiece. In block 502, a substrate for a microelectronic workpiece is received, and the substrate has a material to be etched from the surface of the substrate. In block 504, a liquid etch solution is applied to the surface of the substrate, and the liquid etch solution has a first level of reactants with respect to the material. In block 506, the liquid etch solution is illuminated to cause the liquid etch solution to have a second level of reactants with respect to the material, and the second level is greater than the first level. In block 508, the material is oxidized with the liquid etch solution to form oxidized material. In block 510, the oxidized material is removed. It is noted that additional and/or different steps could also be used while still taking advantage of the illumination techniques described herein.

Figure 5B:
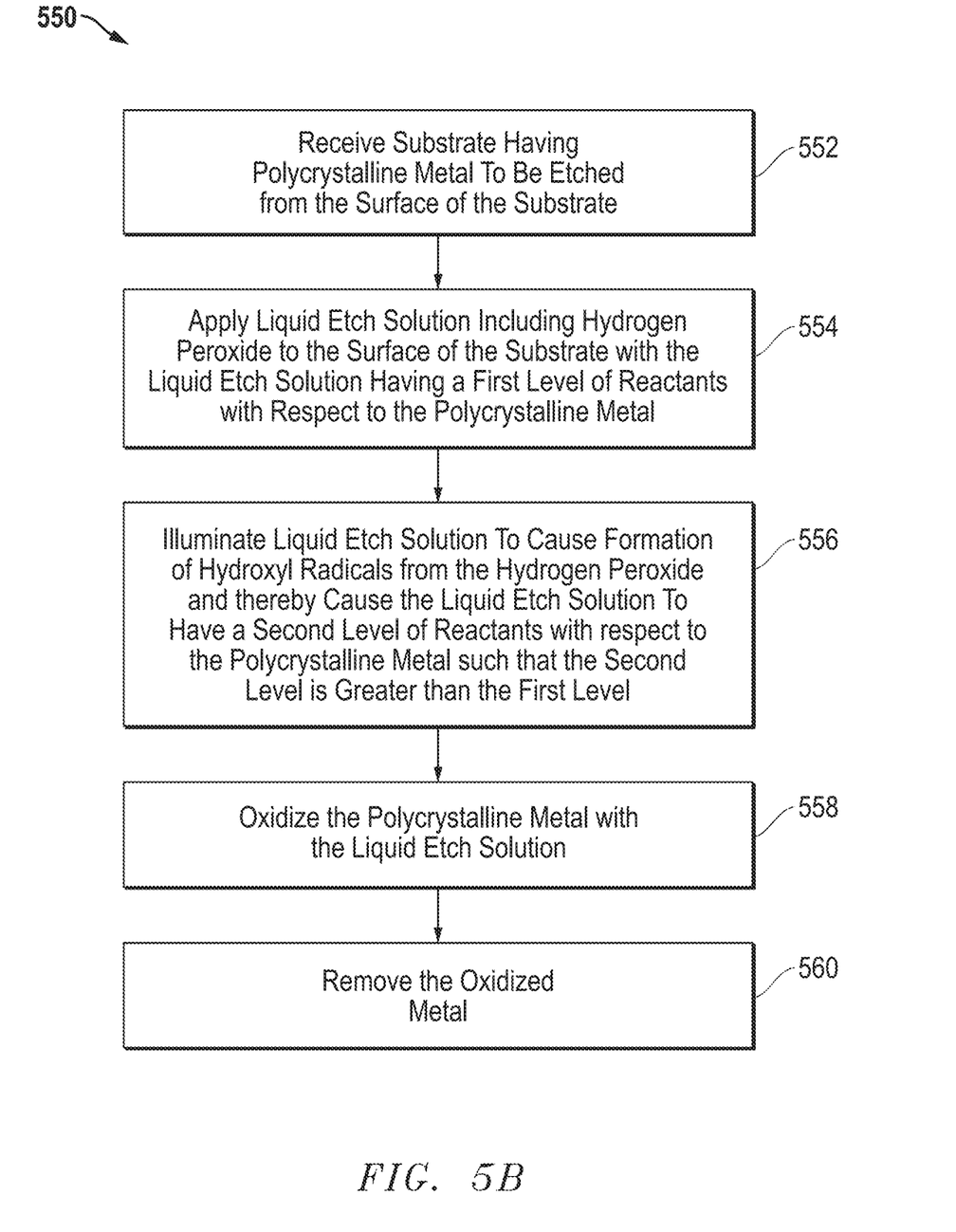
FIG. 5B is a process flow diagram of an example embodiment where illumination is used to form hydroxyl radicals within a liquid etch solution having hydrogen peroxide thereby improving etch uniformity for an etch of a polycrystalline metal on the surface of a substrate for a microelectronic workpiece.

FIG. 5B is a process flow diagram of an example embodiment 550 where illumination is used to form hydroxyl radicals within a liquid etch solution having hydrogen peroxide thereby improving etch uniformity for an etch of a polycrystalline metal on the surface of a substrate for a microelectronic workpiece. In block 552, a substrate for a microelectronic workpiece is received, and the substrate has a polycrystalline metal to be etched from the surface of the substrate. In block 554, a liquid etch solution including hydrogen peroxide is applied to the surface of the substrate, and the liquid etch solution has a first level of reactants with respect to the polycrystalline metal. In block 556, the liquid etch solution is illuminated to cause formation of hydroxyl radicals from the hydrogen peroxide, and the formation of hydroxyl radicals at least in part causes the liquid etch solution to have a second level of reactants with respect to the polycrystalline metal. Further, the second level of reactants is greater than the first level of reactants. In block 558, the polycrystalline metal is oxidized with the liquid etch solution to form an oxidized metal. In block 560, the oxidized metal is removed. It is noted that additional and/or different steps could also be used while still taking advantage of the illumination techniques described herein.

Figure 6:
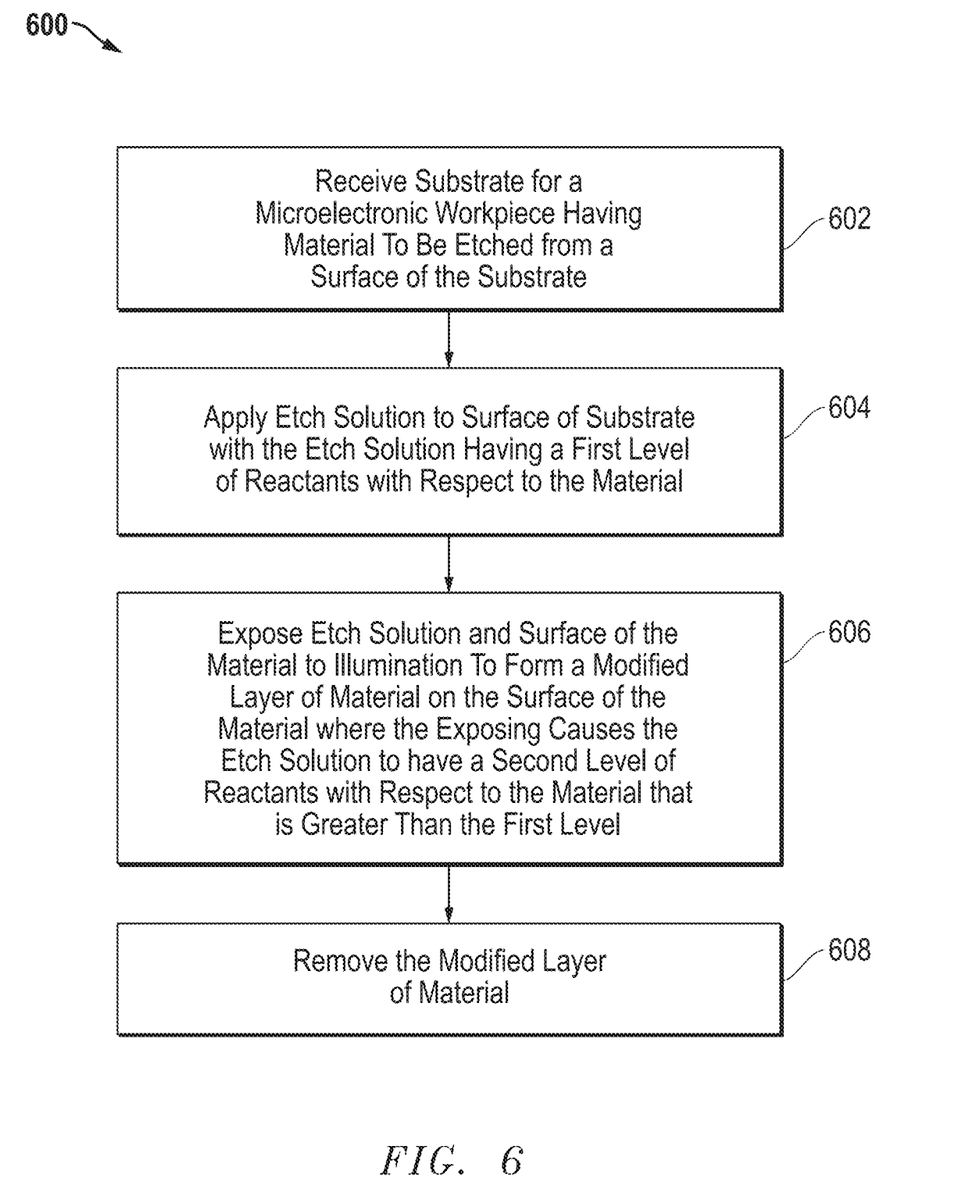
FIG. 6 is a process flow diagram of an example embodiment where illumination is used to adjust reactants within an etch solution (e.g., at least one of gaseous etch solution, a liquid etch solution, or a combination thereof) thereby improving etch uniformity for an etch of a material on the surface of a substrate for a microelectronic workpiece.

FIG. 6 is a process flow diagram of an example embodiment 600 where illumination is used to adjust reactants within an etch solution (e.g., at least one of gaseous etch solution, a liquid etch solution, or a combination thereof) thereby improving etch uniformity for an etch of a material on the surface of a substrate for a microelectronic workpiece. In block 602, a substrate for a microelectronic workpiece is received, and the substrate has a material to be etched from a surface of the substrate. In block 604, an etch solution is applied to the surface of the substrate, and the etch solution has a first level of reactants with respect to the material. In block 606, the etch solution and the surface of the material are exposed to illumination to form a modified layer of material on the surface of the material, and this exposure causes the etch solution to have a second level of reactants with respect to the material that is greater than the first level. In block 608, the modified layer of material is removed. It is noted that additional and/or different steps could also be used while still taking advantage of the illumination techniques described herein.

Figure 7:
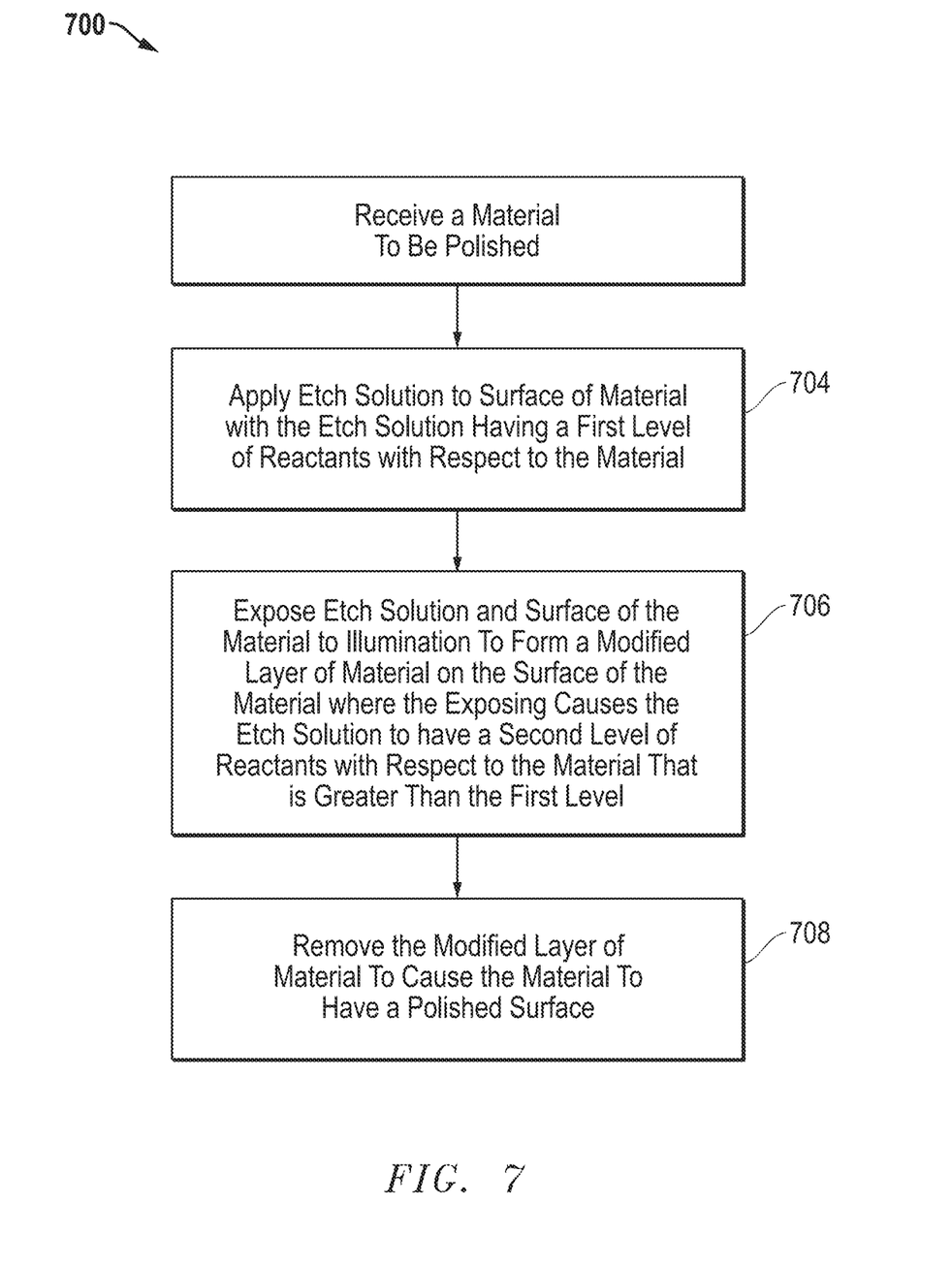
FIG. 7 is a process flow diagram of an example embodiment where illumination of an etch solution (e.g., at least one of gaseous etch solution, a liquid etch solution, or a combination thereof) is used to polish a material.

FIG. 7 is a process flow diagram of an example embodiment 700 where illumination of an etch solution (e.g., at least one of gaseous etch solution, a liquid etch solution, or a combination thereof) is used to polish a material. In block 702, a material to be polished is received. In block 704, an etch solution is applied to the surface of the material, and the etch solution has a first level of reactants with respect to the material. In block 706, the etch solution and the surface of the material are exposed to illumination to form a modified layer of material on the surface of the material, and this exposure causes the etch solution to have a second level of reactants with respect to the material that is greater than the first level. In block 708, the modified layer of material is removed to cause the material to have a polished surface. The polished surface is polished in that it has less surface variation than the surface of the original material being etched. It is noted that additional and/or different steps could also be used while still taking advantage of the illumination techniques described herein.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to photoresist (PR) layers can be implemented using optical lithography, extreme ultra-violet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD (critical dimension) target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of processing a substrate for a microelectronic workpiece, comprising:
   receiving a substrate for a microelectronic workpiece having a polycrystalline material to be etched from a surface of the substrate;
   applying an etch solution to the surface of the substrate, the etch solution having a first level of reactants with respect to the polycrystalline material;
   exposing the etch solution and the surface of the material to illumination to form an oxidized layer of material on the surface of the polycrystalline material, the exposing causing the etch solution to have a second level of reactants with respect to the polycrystalline material that is greater than the first level; and
   removing the oxidized layer of material by dissolving, wherein the oxidizing having an oxidation rate constant greater than a dissolution rate constant for the dissolving.

2. The method of claim 1, wherein the etch solution comprises at least one of gaseous etch solution, a liquid etch solution, or a combination thereof.

3. The method of claim 1, further comprising repeating the exposing and removing in a cyclic manner to etch the material.

4. The method of claim 1, wherein the exposing and removing are performed in at least one of a single process step or different process steps.

5. The method of claim 1, wherein the etch solution comprises a liquid etch solution.

6. The method of claim 5, wherein the removing comprises using the liquid etch solution in a separate process step to dissolve the oxidized material.

7. The method of claim 5, wherein the etch solution comprises an aqueous solution including hydrogen peroxide, and wherein the removing comprises using an aqueous solution including a complexing agent.

8. The method of claim 7, wherein the complexing agent comprises at least one of citrate, ethylene diamine, ethylendiamintetraacetate (EDTA), malic acid, oxalic acid, glycine, alanine, or iminodiacetic acid.

9. The method of claim 5, wherein the removing comprises dissolving the oxidized material using the liquid etch solution simultaneously with the oxidizing.

10. The method of claim 9, wherein the liquid etch solution comprises an aqueous solution including hydrogen peroxide and citrate.

11. The method of claim 5, wherein the polycrystalline material to be etched comprises a polycrystalline elemental metal, and wherein the polycrystalline elemental metal comprises cobalt.

12. The method of claim 5, wherein the liquid etch solution comprises hydrogen peroxide.

13. The method of claim 12, wherein the illuminating of the hydrogen peroxide causes formation of hydroxyl radicals within the liquid etch solution, wherein the second level of reactants are caused at least in part by the formation of the hydroxyl radicals, and wherein the hydroxyl radicals oxidize the material.

14. The method of claim 13, wherein the illuminating comprises illuminating the liquid etch solution with light having at least one of a wavelength of less than 560 nm or a wavelength from 10 nm to 400 nm.

15. The method of claim 1, wherein the exposing comprises selectively illuminating the etch solution.

16. The method of claim 15, wherein the selectively illumination comprises illuminating with ultraviolet WV) light in one or more on/off patterns.

17. The method of claim 15, wherein the selectively illuminating comprises illuminating with two or more different colors of light, and wherein the removing comprises using two or more different colors of light to illuminate the modified layer of material.

18. The method of claim 15, wherein the selectively illuminating comprises illuminating one or more regions of the etch solution where the oxidized layer is desired and not illuminating other regions of the etch solution.

19. The method of claim 1, wherein the etch solution comprises an aqueous solution including at least one of ozone or hypochlorous acid.

20. The method of claim 1, further comprising adjusting the exposing so that different regions of the etch solution are exposed differently to provide different amounts of etching within the different regions.

21. The method of claim 20, further comprising measuring the polycrystalline material and controlling the adjusting based upon the measuring to provide feed-forward control, and wherein the measuring comprises measuring at least one of a topology for a surface of the polycrystalline material or a thickness of the polycrystalline material.

22. A method of processing a substrate for a microelectronic workpiece, comprising:

receiving a substrate for a microelectronic workpiece having a polycrystalline elemental metal to be etched from a surface of the substrate;

applying a liquid etch solution comprising hydrogen peroxide to the surface of the substrate, the liquid etch solution having a first level of reactants with respect to the polycrystalline elemental metal;

illuminating the liquid etch solution to cause formation of hydroxyl radicals from the hydrogen peroxide, the formation of hydroxyl radicals at least in part causing the liquid etch solution to have a second level of reactants with respect to the polycrystalline elemental metal, the second level of reactants being greater than the first level of reactants;

oxidizing the polycrystalline elemental, metal with the liquid etch solution to form an oxidized metal; and removing the oxidized metal by dissolving, wherein the oxidizing having an oxidation rate constant greater than a dissolution rate constant for the dissolving.

23. The method of claim 22, further comprising repeating the illuminating, oxidizing, and removing to etch the polycrystalline elemental metal.

24. The method of claim 22, wherein the removing comprises dissolving the oxidized metal using the liquid etch solution simultaneously with the oxidizing.

25. A method to polish a surface of a material, comprising:
receiving a polycrystalline elemental metal material to be polished;

applying an etch solution to a surface of the polycrystalline elemental metal material, the etch solution having a first level of reactants with respect to the polycrystalline elemental metal material;

exposing the etch solution and the surface of the polycrystalline elemental metal material to illumination to form an oxidized layer of material on the surface of the polycrystalline elemental metal material, the exposing causing the etch solution to have a second level of reactants with respect to the polycrystalline elemental metal material that is greater than the first level; and removing the modified oxidized layer of material by dissolving to cause the polycrystalline elemental metal material to have a polished surface, the polished surface having less surface variation than the surface of the polycrystalline elemental metal material before the exposing and removing, wherein the oxidizing having an oxidation rate constant greater than a dissolution rate constant for the dissolving.

26. The method of claim 25, wherein the etch solution comprises at least one of gaseous etch solution, a liquid etch solution; or a combination thereof.

27. The method of claim 25, further comprising repeating the exposing and removing in a cyclic manner to polish the material.

* * * * *

UNITED STATES PATENT AND TRADEMARK OFFICE
CERTIFICATE OF CORRECTION

PATENT NO. : 10,896,824 B2
APPLICATION NO. : 16/287669
DATED : January 19, 2021
INVENTOR(S) : Zandi et al.

Page 1 of 1

It is certified that error appears in the above-identified patent and that said Letters Patent is hereby corrected as shown below:

In the Claims

In Columns 14-15, Claim 8, Lines 67-1, delete "ethylendiamintetraacetate" and insert -- ethylenediaminetetraacetate --, therefor.

In Column 15, Claim 16, Line 29, delete "WV)" and insert -- (UV) --, therefor.

In Column 16, Claim 22, Line 14, delete "elemental," and insert -- elemental --, therefor.

In Column 16, Claim 26, Line 49, delete "solution;" and insert -- solution, --, therefor.

Signed and Sealed this
Thirtieth Day of November, 2021

Drew Hirshfeld
*Performing the Functions and Duties of the*
*Under Secretary of Commerce for Intellectual Property and*
*Director of the United States Patent and Trademark Office*